(12) United States Patent
Huang et al.

(10) Patent No.: US 6,228,718 B1
(45) Date of Patent: May 8, 2001

(54) METHOD OF FABRICATING A SELF-ALIGNED SPLIT GATE OF A FLASH MEMORY

(75) Inventors: Chih-Jen Huang, Hsinchu; Shih-Fang Hong, Kaohsiung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/468,558

(22) Filed: Dec. 21, 1999

(51) Int. Cl.[7] .................................. H01L 21/8247
(52) U.S. Cl. ............................ 438/266; 438/279
(58) Field of Search ........................ 438/257–267, 438/279

(56) References Cited

U.S. PATENT DOCUMENTS

| B 5,856,224 | * | 1/1999 | Sheu | 438/266 |
| B 5,877,523 | * | 3/1999 | Liang et al. | 257/315 |
| B1 6,168,995 | * | 1/2001 | Kelley et al. | 438/266 |
| B1 6,180,461 | * | 1/2001 | Ogura | 438/266 |

* cited by examiner

*Primary Examiner*—Richard Booth
(74) *Attorney, Agent, or Firm*—Thomas, Kayden, Horstemeyer & Risley

(57) ABSTRACT

The present invention is a method of fabricating a self-aligned split gate of flash memory. Aligned layers are formed on predetermined source regions and predetermined drain regions in advance. Spacers are formed on the sidewalls of the aligned layers. An etching rate of the spacers is different from an etching rate of the aligned layers. Therefore, if misalignment occurs during the patterning process to form a split control gate layer, the spacers also can be left after the aligned layer is removed. The remaining spacers serves as a implant mask during the implantion for the sources and the drains formation, so that the sources and the drains are formed in the respective positions of the aligned layers by self-alignment.

20 Claims, 8 Drawing Sheets

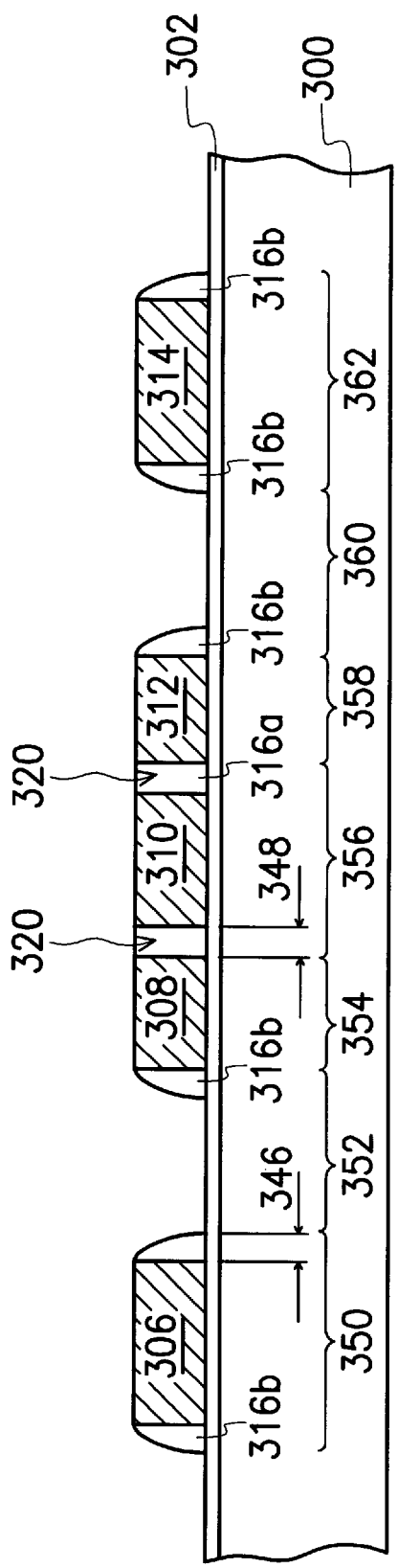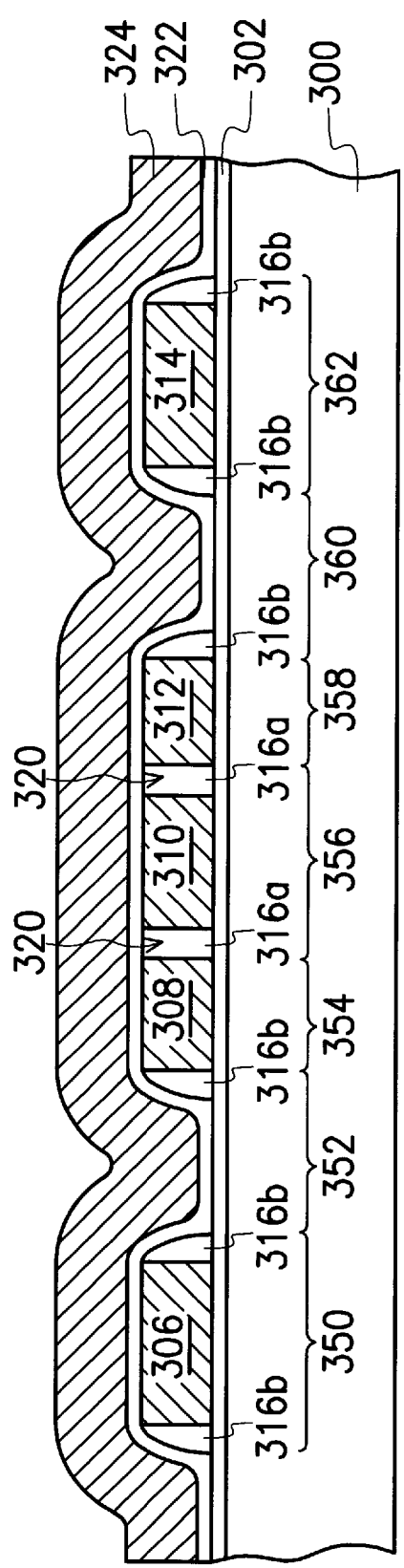

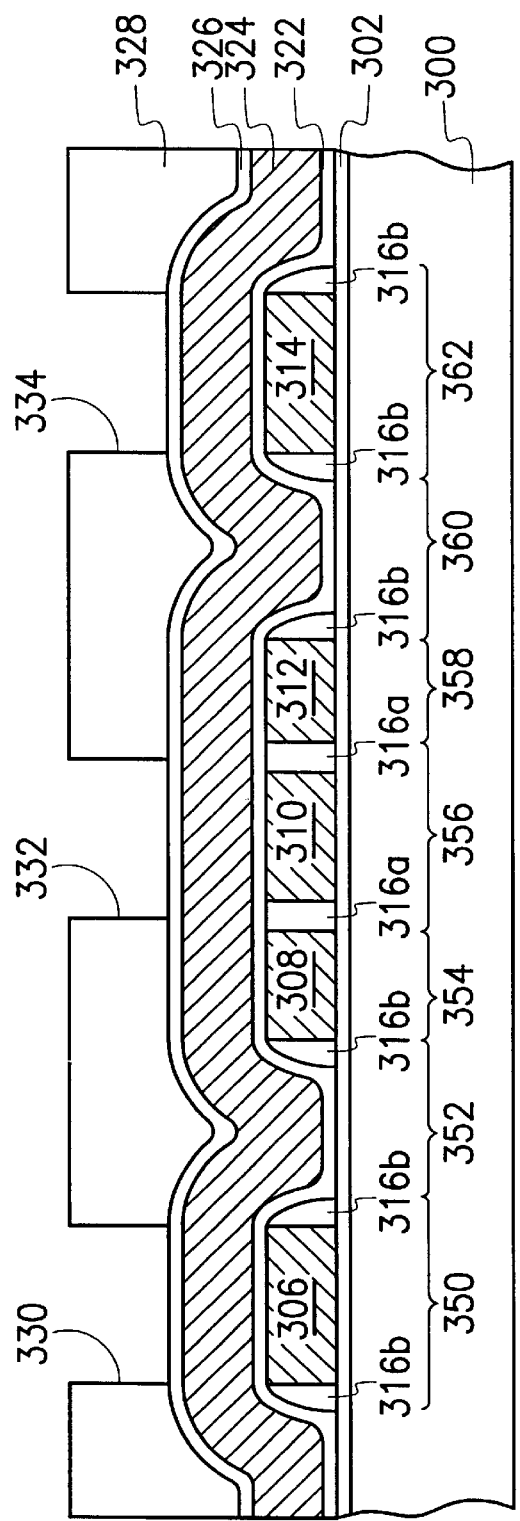
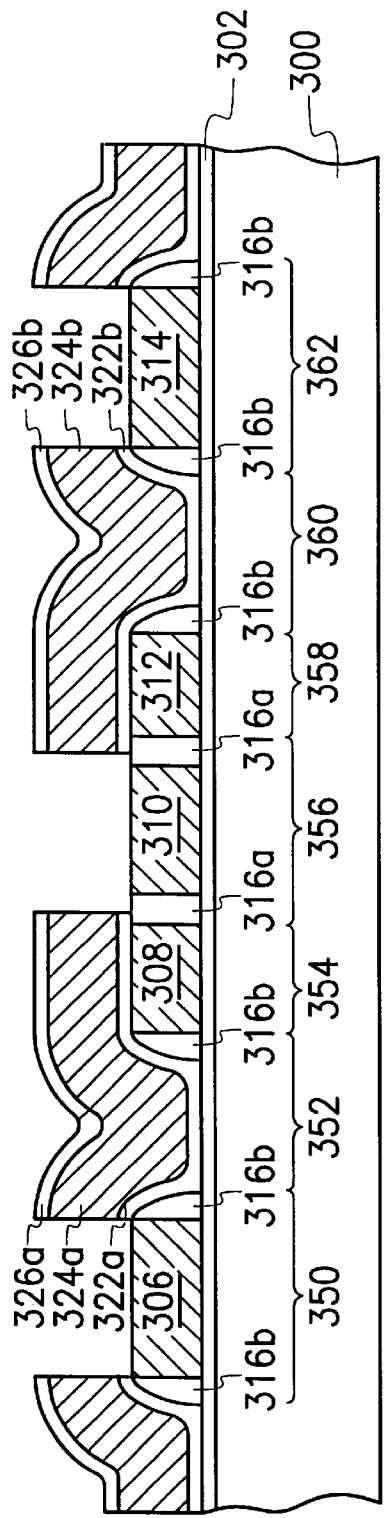

METHOD OF FABRICATING A SELF-ALIGNED SPLIT GATE OF A FLASH MEMORY

BACKGROUND OF THE INVENTION

1. Field of the Invention

The invention relates to a method of fabricating a flash memory. More particularly, the present invention relates to a method of fabricating a self-aligned split gate of a flash memory.

2. Description of the Related Art

At present, nonvolatile memory is widely used in the whole range of electrical devices. In particular, programmable nonvolatile memory having a flash memory structure such as the erasable programmable read-only memory (EPROM) and the electrically erased programmable read-only memory (EEPROM) has attracted immense interest.

In general, a flash memory comprises two gates, a floating gate for charge storage and a control gate for data accessing. The floating gate is in a floating state without being connected to any electrical circuit and is located between the control gate and a substrate while the control gate is connected to a word line.

An over-erase phenomenon easily occurs when erasing the conventional flash memory, so that verification circuits must necessarily be formed in the periphery region of the substrate on verify the memory cells and further to avoid the over-erase problem. However, the processes for fabricating a flash memory, including the additional steps for the verification circuits is complicated and the cost of the fabricating process is increased. In order to overcome the problems of the conventional flash, a split-gate flash memory is developed.

FIG. 1A–1D are schematic, cross-sectional views illustrating a method of fabricating a split gate for a flash memory cell according to the prior art method.

Referring to the FIG. 1A, a tunneling oxide layer 102 is formed on a substrate 100. Therefore, a polysilicon layer is formed and patterned to form a floating gate layer 104. Referring to FIG. 1B, a dielectric layer 106 and another conducting layer 108 are formed, and then the conducting layer 108 is patterned by a photolithography process and an etching process to form a control gate layer 108a of the split-gate of the flash memory cell, as shown in FIG. 1C. Referring to FIG. 1D, with the control gate layer 108a and the floating gate layer 104 serving as an implant mask, an ion implantion is performed to implant dopant in the substrate 100, so that a source 110 and a drain 112 are formed. Thereafter, a part of the dielectric layer 106 and a part of the tunneling oxide layer 102 are removed by a wet etching process, and the dielectric layer 106a and the tunneling oxide layer 102a under the control gate layer 108a are left. Consequently, the split-gate of the flash memory cell is completed.

In the about-mentioned process of fabricating the split-gate of flash memory cell, if misalignment occurs during the process of patterning the polysilicon layer 108 for forming the control gate layer 108a, the position of the control gate layer 108a is changed.

Since the channel length 120 of the control gate 108a profoundly affects the performance of the flash memory cell, it is important to controlling the channel length 120 of the control gate 108a in the process. Furthermore, changes in the channel length 120 of the control gate 108a affects the erase and the program operations of the split-gate of the flash memory.

Positive charges are injected into the floating gate 104 while erasing the split-gate of the flash memory, so that negative charges correspondingly rise in the floating channel region 130 of the substrate 100. The rising negative charges are equivalent to a virtual extended structure of the source 110. If the channel length 120 of the control gate 108a is shortened because of misalignment, the over-erase phenomenon easily occurs and the performance margin is reduced. Furthermore, the shortened channel length 120 causes the short channel effect and leads a part of the sub-threshold current into the floating gate 104, therefore affecting the capacitance of the split-gate of the flash memory.

On the other hand, the floating gate channel region 130 is in an off state after a program operation; the punch-through margin of the split-gate of the flash memory is limited by the distance between the source 110 and the drain 112 and is limited by the junction depth of the source 110 and the drain 112. Consequently, shortening the channel length 120 of the control gate by misalignment leads to a reduction in the distance between the source 110 and the drain 112, so that punch-through occurs in the whole region between the source 110 and the drain 112.

SUMMARY OF THE INVENTION

The present invention is a method of fabricating a self-aligned split gate of the flash memory. Aligned layers are formed on predetermined source regions and predetermined drain regions in advance. Spacers are formed on the sidewalls of the aligned layers. The etching rate of the spacers is different from the etching rates of the aligned layers. Therefore, if misalignment occurs during the patterning process to form a split control gate layer, the spacers remain after the aligned layer is removed. The remaining spacers serve as an implant mask during the implantion for source and drain formation, so that the sources and the drains are formed in the positions of the aligned layers by self-alignment.

A method of fabricating a self-aligned split gate of the flash memory according to the first preferred embodiment of the method according to the present invention is provided. A substrate is provided, and the substrate is sequentially divided into a first drain region, a first control gate channel region, a first floating gate channel region, a source region, a second floating gate channel region, a second control gate channel region, and a second drain region. A tunnelling oxide layer and a first conducting layer are formed sequentially over the substrate. The first conducting layer is patterned to form a first aligned layer, a second aligned layer, and a third aligned layer. The first aligned layer covers a part of the first drain region. The second aligned layer covers the first floating gate channel region, the source region and the second floating gate channel region. The third aligned layer covers a part of the second drain region. Thereafter, spacers are formed on the sidewalls of the first aligned layer, the second aligned layer, and the third aligned layer. A conformal dielectric layer and a second conducting layer are then formed over the substrate. A mask layer is formed on the second conducting layer, which mask layer has a first opening over the first drain region, a second opening over the source region, and a third opening over the second drain region. The second conducting layer exposed by the first, the second, and the third opening is removed, and then the dielectric layer and the first aligned layer, a part of the second aligned layer, and the third aligned layer thereunder are also removed in a self aligned process. The tunnelling oxide layer over the first drain region, the source region, and the second drain region are exposed. A remaining second aligned layer over the first floating gate channel region is used as a first floating gate layer. A remaining second aligned layer over the second floating gate channel region is used as a second floating gate layer. A remaining second conducting layer over the first control gate channel region and the first floating gate channel region is used as a first control gate layer. A remaining second conducting layer over the second control gate channel region and the second floating gate channel region is used as a second control gate layer. A first drain in the first drain region, a source in the source region and a second drain in the second drain region are formed by implantion after the mask layer is removed.

The spacers have an etching rate that is different from an etching rate of the first conducting layer. An etchant that has a high etching selectivity between the spacers and the first conducting layer is used during the process for removing the second conducting layer, the dielectric layer, the first aligned layer, the part of the second aligned layer, and the third aligned layer under the first opening, the second opening and the third opening. The spacers are left to serve as an implant mask during the implantion process for source and drain formation.

The thickness of the spacers is larger than the misalignment error of photolithography. If misalignment occurs during the photolithography process for patterning the second conducting layer, the tunneling oxide layer over the first control gate channel region and the second control gate channel region is not exposed after removing the first aligned layer, the part of the second aligned layer, and the third aligned layer. The spacers can serve as a mask during the implantion to form the first drain and the second drain in the positions of the first aligned layer and the third aligned layer, respectively. Consequently, the first drain and the second drain are formed by self-alignment in the positions of the first aligned layer and the second aligned layer, respectively.

The first drain and the second drain are formed in the positions of the first aligned layer and the third aligned layer, respectively, by self-alignment. The position of one sidewall of the first floating gate, which sidewall is near the first drain, is decided after the first aligned layer, the second aligned layer, and the third aligned layer are formed. Similarly, the position of the sidewall of one of the second floating gates, which sidewall is near the second drain, is also decided after the first aligned layer, the second aligned layer, and the third aligned layer are formed. Therefore, the length of the first control gate channel region between the first floating gate layer and the first drain, and the length of the second control gate channel between the second floating gate layer and the second drain are fixed, while the position of the first aligned layer, the second aligned layer and the third aligned layer are decided. The length of the first control gate channel and the length of the second control gate channel are not affected by the process of patterning the second conducting layer for forming the first control gate layer and the second control gate layer. Consequently, the channel length of the control gate can be controlled by self-alignment, and the channel length cannot be changed if misalignment occurs during the photolithography process.

A method of fabricating a self-aligned split gate of the flash memory according to the second embodiment of the method according to the present invention is provided. A substrate is provided, and the substrate is divided sequentially into a first drain region, a first control gate channel region, a first floating gate channel region, a source region, a second floating gate channel region, a second control gate channel region, and a second drain region. A tunnelling oxide layer and a first conducting layer are formed sequentially over the substrate. The first conducting layer is then patterned to form a first aligned layer, a first floating gate layer, a second aligned layer, a second floating gate layer, and a third aligned layer. The first aligned layer covers a part of the first drain region. The first floating gate layer covers the first floating gate channel region. The second aligned layer covers a part of the source region. The second floating gate layer covers the second floating gate channel region. The third aligned layer covers a part of the second drain region. Gaps are located between the first floating gate layer and the second aligned layer, and between the second aligned layer and the second floating gate layer. The gaps are filled with an insulating layer and spacers are formed on the sidewalls of the first aligned layer, the first floating gate layer, the second floating gate layer, and the third aligned layer. Thereafter, a conformal dielectric layer and a second conducting layer are formed over the substrate. The conformal dielectric layer and the second conducting layer over the first aligned layer, the second aligned layer, and the third aligned layer are removed. A remaining second conducting layer over the first control gate channel region and the first floating gate channel region is used as a first control gate layer. A remaining second conducting layer over the second control gate channel region and the second floating gate channel region is used as a second control gate layer. The first aligned layer, the second aligned layer, and the third aligned layer are removed. A first drain in the first drain region, a source in the source region, and a second drain in the second drain region are formed by implantion.

The spacers and the insulating layer have etching rates that are different from an etching rate of the first conducting layer. An etchant that has high etching selective between the spacers and the first conducting layer and has high etching selective between the insulating layer and the first conducting layer is used during the process for removing the second conducting layer, the dielectric layer, the first aligned layer, the second aligned layer, and the third aligned layer under the first opening, the second opening and the third opening. Therefore, the spacers and the insulating layer are left to serve as an implant mask during the implantion process of the sources and the drains formation.

The thickness of the spacers and the thickness of the insulating layer are larger than the misalignment error of photolithography. Therefore, if misalignment occurs during the photolithography process for patterning the second conducting layer, the tunneling oxide layer over the first control gate channel region and the second control gate channel region is not exposed after removing the first aligned layer, the second aligned layer, and the third aligned layer. The spacers and the insulating layer can serve as a mask during the implantion to allow the first drain, the source and the second drain to be formed in the positions of the first aligned layer, the second aligned layer and the third aligned layer, respectively. Consequently, the first drain, the source, and the second drain are formed by self-alignment in the positions of the first aligned layer, the second aligned layer and the third aligned layer, respectively.

The first drain, the source and the second drain are formed in the positions of the first aligned layer, the second layer and the third aligned layer, respectively, by self-alignment. The position of the sidewall of the first floating gate, which sidewall is near the first drain, is decided after the first aligned layer, the first floating gate layer, the second aligned layer, the second floating gate layer, and the third aligned layer are formed. Similarly, the position of the sidewall of the second floating gate, which sidewall is near the second drain, is also decided after the first aligned layer, the first floating gate layer, the second aligned layer, the second floating gate layer, and the third aligned layer are formed. Therefore, the length of the first control gate channel region between the first floating gate layer and the first drain, and the length of the second control gate channel between the second floating gate layer and the second drain are fixed, while the positions of the first aligned layer, the first floating gate layer, the second floating gate layer, and the third aligned layer are decided. The length of the first control gate channel and the length of the second control gate channel are not affected by the process of patterning the second conducting layer for forming the first control gate layer and the second control gate layer formation. Consequently, the channel length of the control gate can be control by self-alignment, and are not changed even if misalignment occurs during the photolithography process.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A–3H are schematic, cross-sectional views illustrating a method of fabricating a self-aligned split gate of a flash memory according to the second preferred embodiment of the method according to the present invention.

DESCRIPTION OF THE PREFERRED EMBODIMENTS

The first preferred embodiment

FIG. 2A–2E are schematic, cross-sectional views illustrating a method of fabricating a self-aligned split gate of a flash memory according to the first preferred embodiment of the present invention.

Figure 1A:
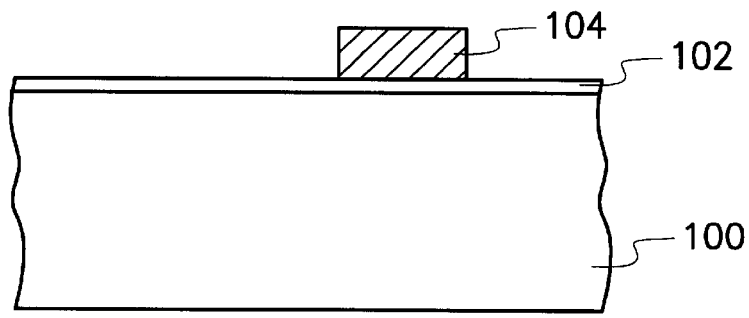
FIGS. 1A–1D are schematic, cross-sectional views illustrating a method of fabricating a split gate of a flash memory according to the prior art.
Figure 1B:
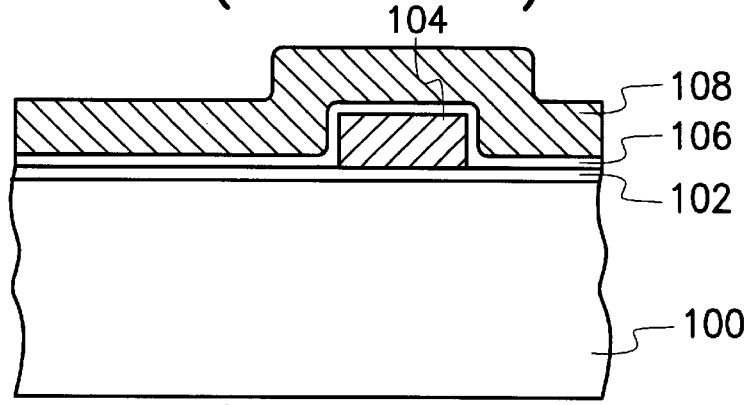
Figure 1C:
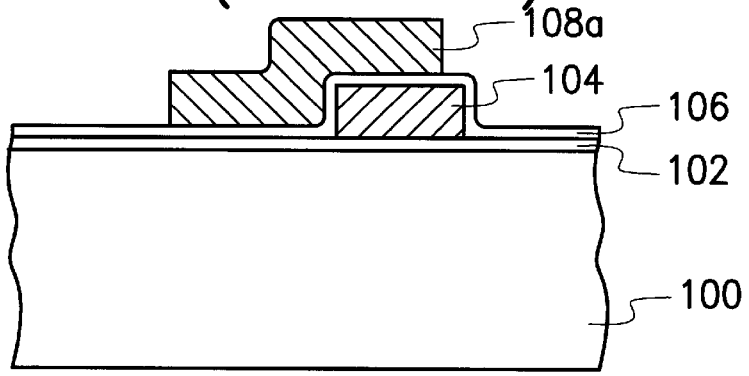
Figure 1D:
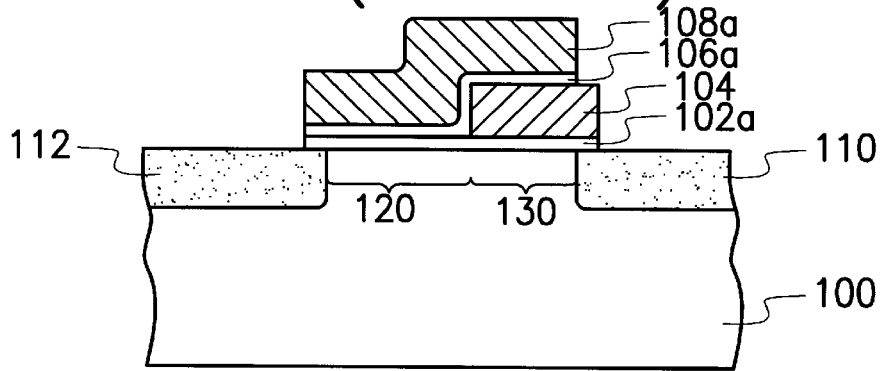
Figure 2A:
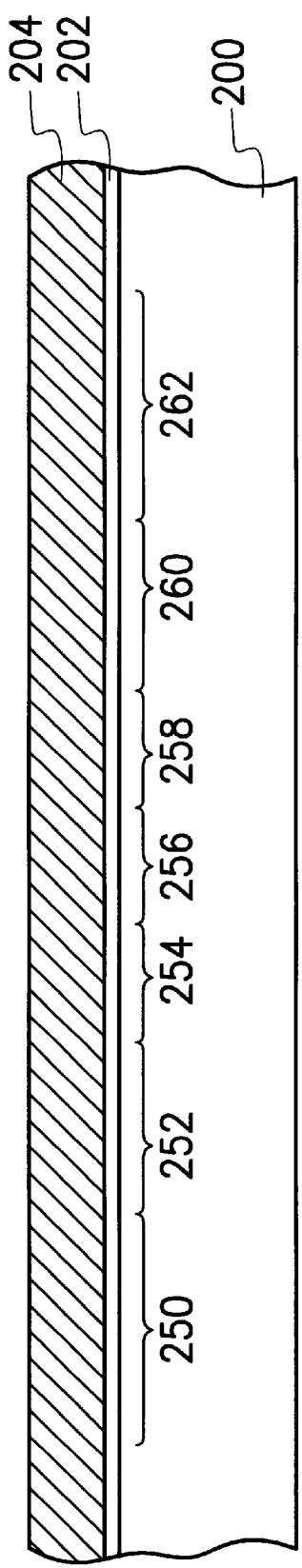
FIGS. 2A–2E are schematic, cross-sectional views illustrating a method of fabricating a self-aligned split gate of a flash memory according to the first preferred embodiment of the method according to the present invention.

Referring to FIG. 2A, a substrate 200 is provided. The substrate 200 is divided sequentially into a first drain region 250, a first control gate channel region 252, a first floating gate channel region 254, a source region 256, a second floating gate channel region 258, a second control gate channel region 260, and a second drain region 262. A material of the substrate 200 comprises a p-type silicon. A tunnelling oxide layer 202 is formed over the substrate 200 by, for example, thermal oxidation to a thickness of about 80–100 Angstroms. A conducting layer 204 is then formed on the tunnelling oxide layer 202. A material of the conducting layer 204 comprises doped polysilicon formed by, for example, chemical vapor deposition to a thickness of about 1500–2000 Angstroms.

Figure 2B:
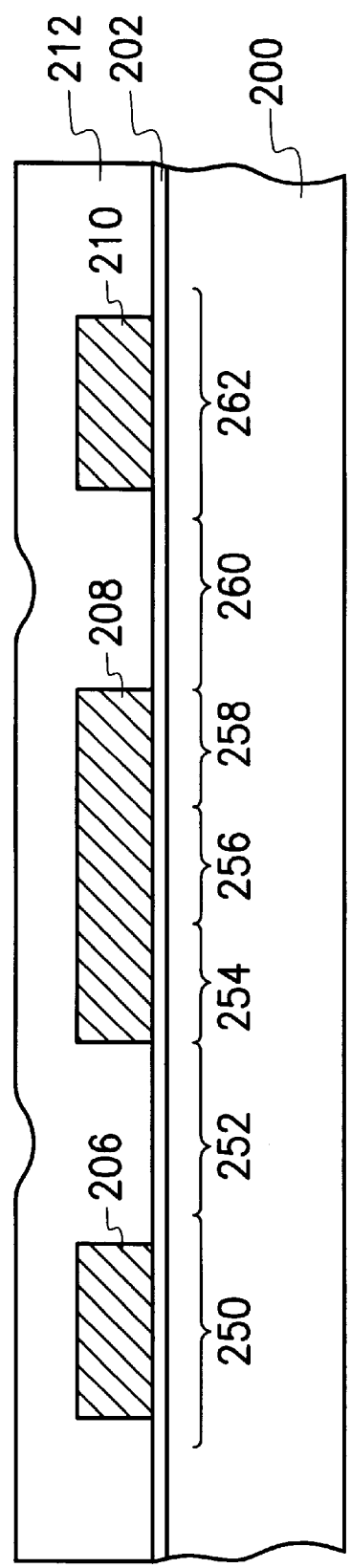

Referring to FIG. 2B, the conducting layer 204 is patterned by photolithography and etching, so that a first aligned layer 206, a second aligned layer 208, and a third aligned layer 210 are formed. The first aligned layer 206 is located over a part of the first drain region 250. The second aligned layer 208 is located over the first floating gate channel region 254, the source region 256 and the second floating gate channel region 258. The third aligned layer 210 is located over a part of the second drain region 262.

Thereafter, a material layer 212 is formed over the surfaces of the first aligned layer 206, the second aligned layer 208, the third aligned layer 210, and the tunnelling oxide layer 202. The material layer 212 has an etching rate that is different from that of the conducting layer 204. A material of the material layer 212 comprises silicon oxide formed by, for example, chemical vapor deposition using tetraethylorthosilicate as a source gas.

Figure 2C:
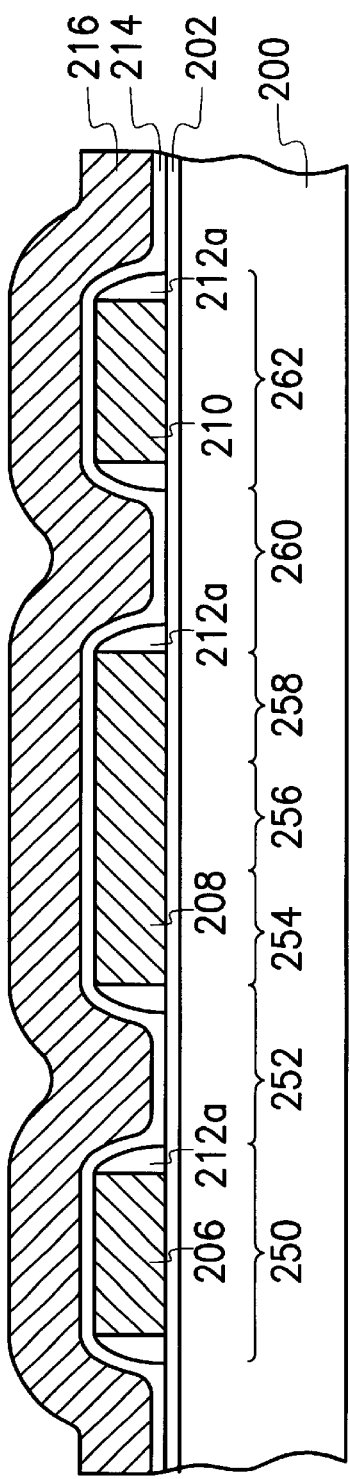

Referring to FIG. 2C, an anisotropic etching back process is conducted on the material layer 212 to form spacers 212a on the sidewalls of the first aligned layer, the second aligned layer, and the third aligned layer. The gases, for example, tetrafluoromethane ($CF_4$), trifluoromethane ($CHF_3$), or hexafluoroethane ($C_2F_6$) and octafluropropane ($C_3F_8$) are used as reactive gases during the anisotropic etching back process. A thickness of the spacers 212a is thicker than the range of the maximum misalignment error for photolithography.

Thereafter, a conformal dielectric layer 214 and another conducting layer 216 are formed over the substrate 200. A material of the dielectric layer 214 comprises an oxide/nitride/oxide structure formed by chemical vapor deposition to a thickness of about 200 Angstroms. A material of the conducting layer 216 comprises doped polysilicon formed by, for example, low pressure chemical vapor deposition to a thickness of about 2000–2500 Angstroms.

Figure 2D:
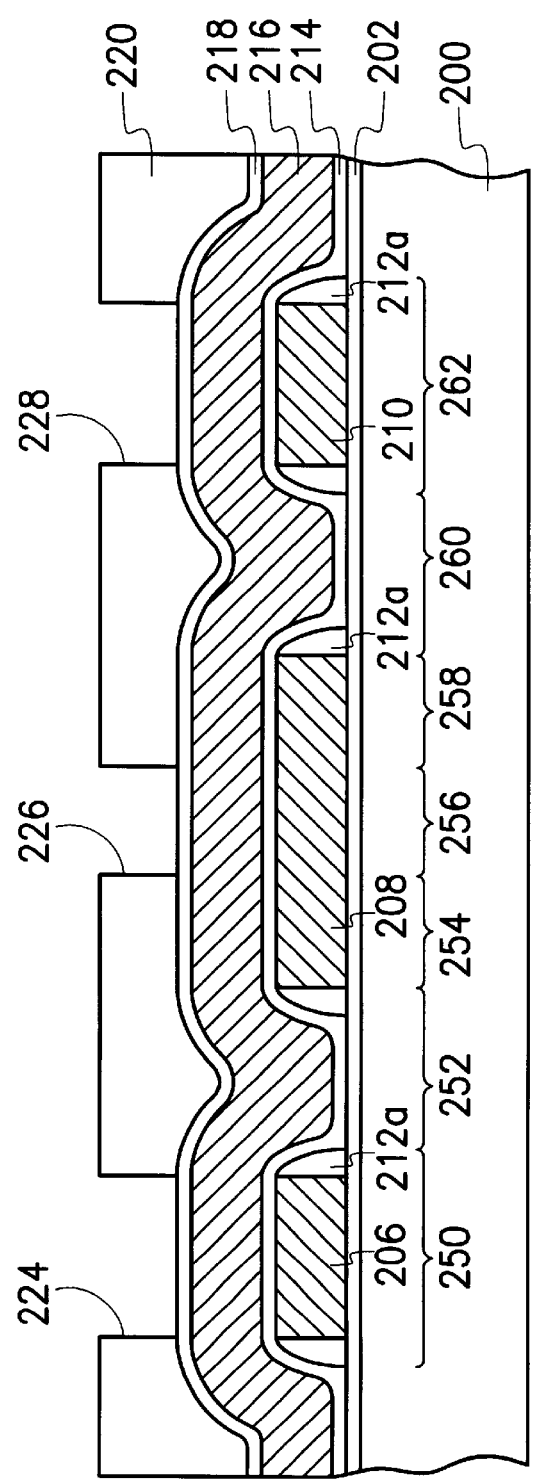

Referring to FIG. 2D, the subsequent process comprises patterning the conducting layer 216. However, to avoid the problem of resolution of photolithography due to the high reflection of the conducting layer 216, an anti-reflection coating layer 218 is preferably formed on the conducting layer 216 to reduce the degree of reflection of the conducting layer 216 and to increase the resolution of photolithography. A material of the anti-reflection coating layer 218 is, for example, silicon oxynitride to a thickness of about 300 Angstroms. A mask layer 220 such as photoresist is formed on the anti-reflection coating layer 218. The mask layer 220 has a first opening 224 over the first drain region 250, a second opening 226 over the source region 256, and a third opening 228 over the second drain region 262.

Figure 2E:
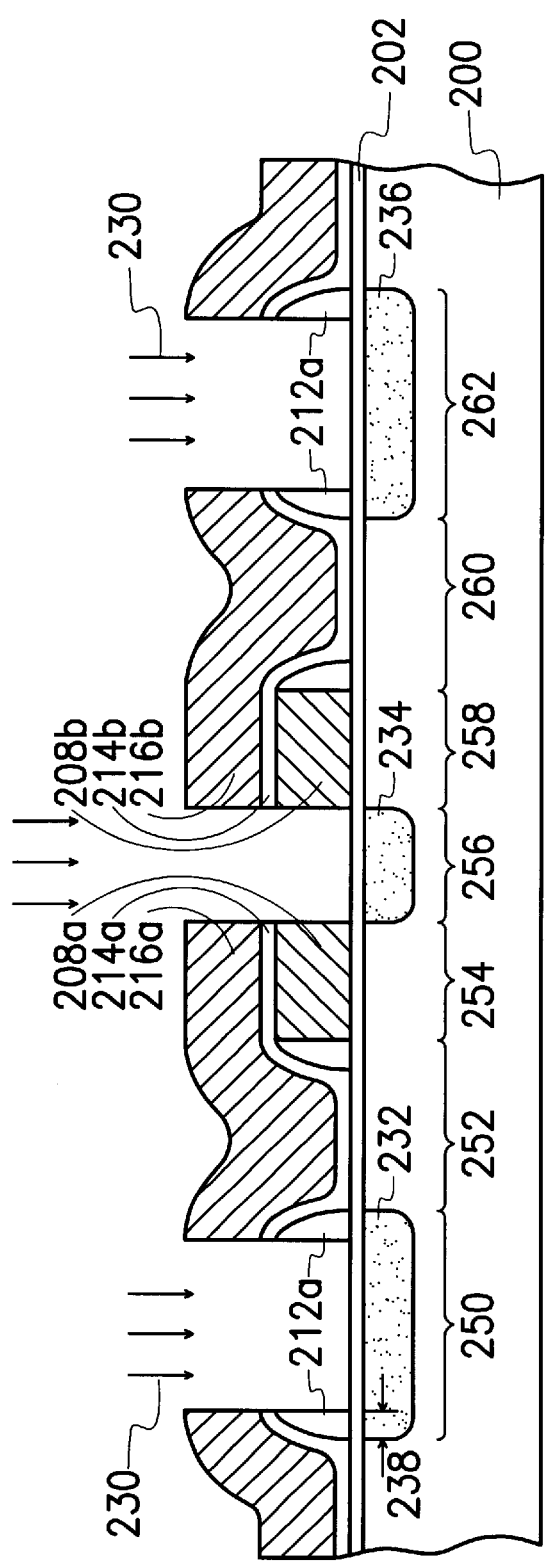

Referring to FIG. 2E, the anti-reflection coating layer 218 exposed by the first opening 224, the second opening 226 and third opening 228 is removed, and the conducting layer 216, dielectric layer 214, the first aligned layer 206, a part of the second aligned layer 208, and the third aligned layer 210 thereunder are removed. Preferably, an etching process is performed using an etchant that has a high etching selectivity for the aligned layers 206, 208, and 210 to the spacers 212a. Consequently, the tunneling oxide layer 202 over the part of the first drain region 250, the source region 256 and the part of the second drain region 262 is exposed, and the second aligned layer 208a, 208b, and the dielectric layer 214a, 214b are left. The remaining second aligned layer 208a is located over the first floating gate channel region 254, and is used as a first floating gate of the flash memories. The remaining second aligned layer 208b is located over the second floating gate channel region 258, and is used as a second floating gate of the flash memories. The remaining dielectric layer 214a and the remaining second conducting layer 216a are located over the first control gate channel region 252 and the first floating gate channel region 254. The remaining dielectric layer 214b and the remaining second conducting layer 216b are located over the second control gate channel region 260 and the second floating gate channel region 258. The remaining second conducting layer 216a is used as a first control gate layer, while the remaining second conducting layer 216b is used as a second control gate layer.

Thereafter, the mask layer 220 and the anti-reflection coating layer 218 are removed. A first drain 232, a source 234, and a second drain 236 are respectively formed in the first drain region 250, the drain region 256 and the second drain region 262. The first drain 232, the source 234, and the second drain 236 are formed by an ion implantion 230 while using the conducting layer 216a (the first control gate layer) and the conducting layer 216b (the second control gate layer) as mask layers to implant dopants such as n-type ions into the substrate 200 with a concentration of about 10E13/$cm^2$ to about 10E15/$cm^2$. An annealing process is then conducted to activate the dopants, so that the first drain 232, the source 234, and the second drain 236 are formed.

In the present invention, the first aligned layer 206 and the third aligned layer 210 are formed on the first drain region 250 and the second drain region 262 in advance. The spacers 212a are then formed on the sidewall of the first aligned layer 206 and the third aligned layer 210. Since the etching rate of the spacers 212a is different from the etching rates of the first aligned layer 206 and the third aligned layer 210, the first aligned layer 206 and the third aligned layer 210 can be removed and the spacer 212a can be left during the subsequent process. The spacer 212a, the first control gate layer 216a, and the second control gate layer 216b can be used as ion implantion mask layers during the formation of the first drain 232 and the second drain 236, so that the dopants can be implanted into the substrate 200 under the first aligned layer 206 and the third aligned layer 210.

The thickness 238 of the spacers 212a is larger than the misalignment error of photolithography. Therefore, if misalignment occurring during the photolithography process for patterning the second conducting layer 216, the tunneling oxide layer 202 over the first control gate channel region 252 and the second control gate channel region 260 is not exposed after the first aligned layer 206, the part of the second aligned layer 208, and the third aligned layer 210 are removed. The spacers 212a can serve as a mask during the implantion 230 to form the first drain 232 and the second drain 236 on the substrate 200 in the positions of the first aligned layer 206 and the third aligned layer 210, respectively. Consequently, the first drain 232 and the second drain 236 are formed by self-alignment in the positions of the first aligned layer 206 and the second aligned layer 210, respectively.

The first drain 232 and the second drain 236 are formed in the positions of the first aligned layer 206 and the third aligned layer 210, respectively, by self-alignment. The position of the sidewall of the first floating gate 208a, which sidewall is near the first drain 232, is decided after the first aligned layer 206, the second aligned layer 208, and the third aligned layer 210 are formed. Similarly, the position of the sidewall of the second floating gate 208b, which sidewall is near the second drain 262, is also decided after the first aligned layer 206, the second aligned layer 208, and the third aligned layer 210 are formed. Therefore, the length of the first control gate channel region 252 between the first floating gate layer 208a and the first drain 232, and the length of the second control gate channel 260 between the second floating gate layer 208b and the second drain 236 are fixed, while the positions of the first aligned layer 206, the second aligned layer 208 and the third aligned layer 210 are decided. The length of the first control gate channel 252 and the length of the second control gate channel 260 are not affected by the process of patterning the second conducting layer 216 for the first control gate layer 216a and the second control gate layer 216b formation. Consequently, the channel length of the control gate can be controlled by self-alignment, and are not changed even if misalignment occurs during the photolithography process.

The second preferred embodiment

FIG. 3A–3H are schematic, cross-sectional views illustrating a method of fabricating a self-aligned split gate of a flash memory according to the second preferred embodiment of the method according to the present invention.

Figure 3A:
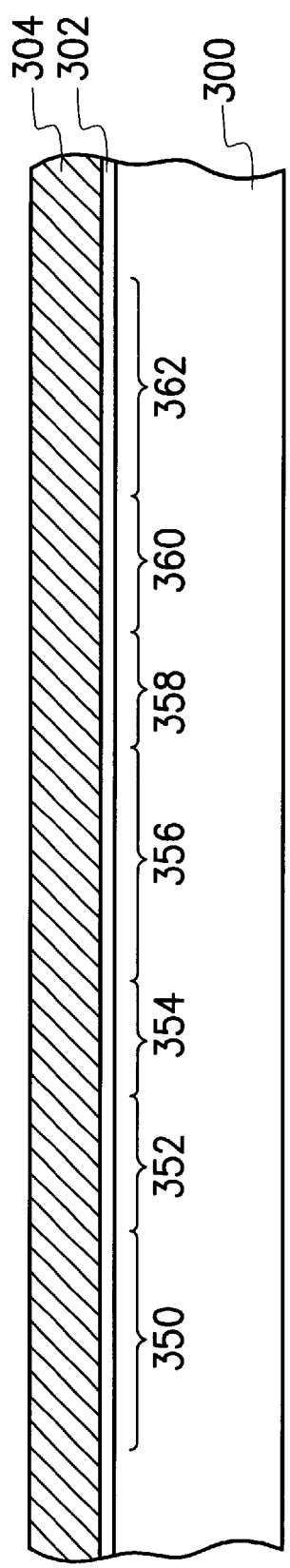

Referring to FIG. 3A, a substrate 300 is provided. The substrate 300 is divided sequentially into a first drain region 350, a first control gate channel region 352, a first floating gate channel region 354, a source region 356, a second floating gate channel region 358, a second control gate channel region 360, and a second drain region 362. A material of the substrate 300 comprises a p-type silicon. A tunnelling oxide layer 302 is formed on the substrate 300 by, for example, thermal oxidation to a thickness of about 80–100 Angstroms. A conducting layer 304 is then formed on the tunnelling oxide layer 302. A material of the conducting layer 304 comprises doped polysilicon formed by, for example, chemical vapor deposition to a thickness of about 1500–2000 Angstroms.

Figure 3B:
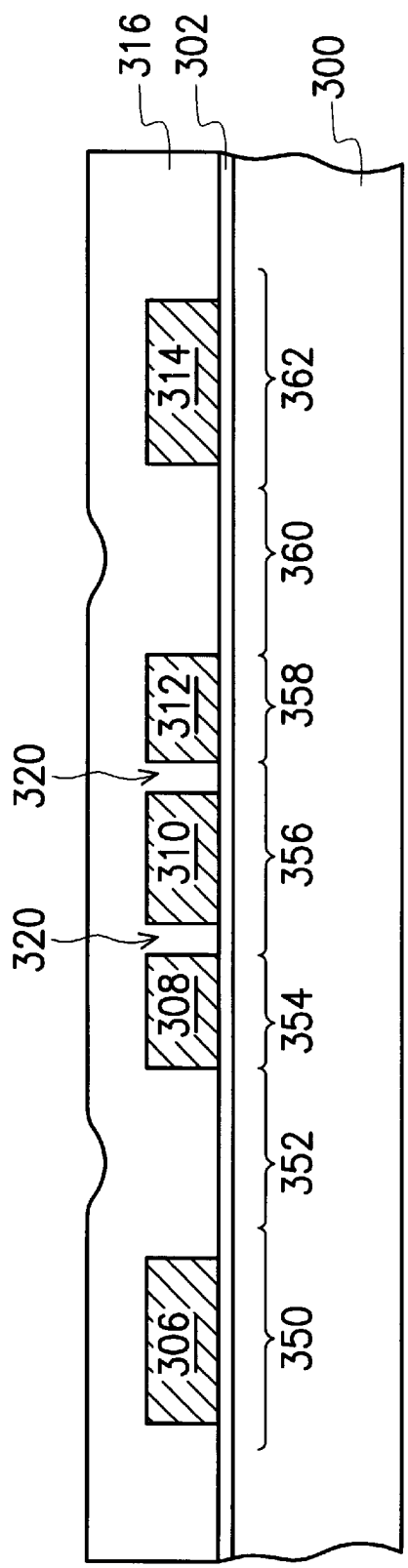

Referring to FIG. 3B, the conducting layer 304 is patterned by photolithography and etching, so that a first aligned layer 306, a first floating gate layer 308a, a second aligned layer 310, a second floating gate layer 312 and a third aligned layer 314 are formed. The first aligned layer 306 is located over a part of the first drain region 350. The first floating gate layer 308 is located over the first floating gate channel region 354. The second aligned layer 310 is located over a part of the source region 356. The second floating gate layer 312 is located over the second floating gate channel region 358. The third aligned layer 314 is located over a part of the second drain region 362. Gaps 320 are located between the first floating gate layer 308 and the second aligned layer 310, and between the second aligned layer 310 and the second floating gate layer 312. The gaps 320 are larger than the maximum error arising from misalignment during photolithography.

Thereafter, a insulating material layer 316 is formed, which covers the surface of the first aligned layer 306, the floating gate layer 308, the second aligned layer 310, the second floating gate layer 312 and the third aligned layer 314, and fill the spaces therebetween. A material of the insulating material layer 316 comprises silicon oxide layer formed by chemical vapor deposition using tetraethylorthosilicate as source gas.

Figure 3C:
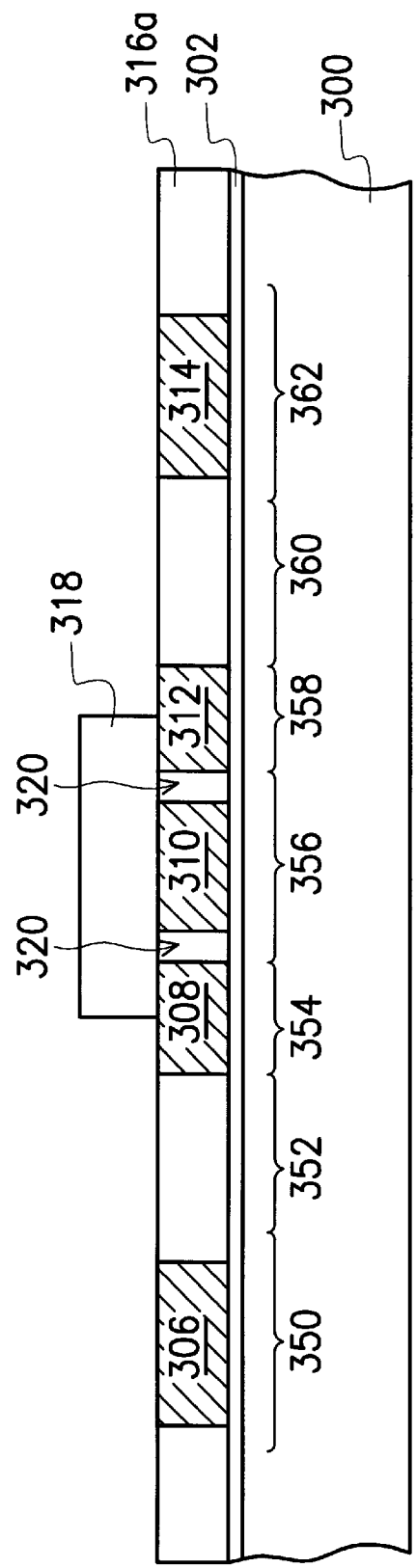

Referring to FIG. 3C, an etching back process is performed on the insulating material layer 316 until the surfaces of the first aligned layer 306, the floating gate layer 308, the second aligned layer 310, the second floating gate layer 312 and the third aligned layer 314 are exposed. With the first aligned layer 306, the floating gate layer 308, the second aligned layer 310, the second floating gate layer 312 and the third aligned layer 314 serving as a stop layer, the etching back process is conducted by an anisotropic etching process using, for example, tetrafluorometlhane ($CF_4$), trifluoromethanie ($CHF_3$), or hexafluoroethane ($C_2F_6$) and octafluoropropane ($C_3F_8$) as reactive gases. A mask layer 318 such as photoresist is formed over the substrate on cover the insulating material layer 316a in the gaps 320, at least.

Referring to FIG. 3D, with the mask layer 318 serving as an etching mask, the insulating material layer 316a is etched by an anisotropic etching process to form pacers 316b on the sidewalls of the first aligned layer 306, the first floating gate layer 308, the second floating gate layer 312, and the third aligned layer 314. The insulating material layer 316a in the gaps 320 is left during the anisotropic etching process because it is protected by the mask layer 318. The thickness of the spacers 316b is larger than the maximum error arising from the misalignment of the photolithography process. Thereafter, the mask layer 318 is removed.

Referring to FIG. 3E, a conformal dielectric layer 322 and another conducting layer 324 are formed on the substrate 300. A material of the dielectric layer 322 comprises, for example, oxide/nitride/oxide structure formed by chemical vapor deposition to a thickness of about 200 Angstroms. The conducting layer 324 is formed by, for example, low-pressure chemical vapor deposition to a thickness of about 2000–2500 Angstroms.

Referring to FIG. 3F, the conducting layer 324 is patterned in the subsequent process. However, to avoid the photolithography resolution problem, which occurs due to the high reflection of the conducting layer 324, an anti-reflection coating layer 326 is preferably formed on the conducting layer 324 to reduce the degree of reflection of the conducting layer 324 and to increase the resolution of photolithography. A material of the anti-reflection coating layer 326 is, for example, silicon oxynitride formed to a thickness of about 300 Angstroms. A mask layer 328 such as photoresist is formed on the anti-reflection coating layer 326. The mask layer 328 has a first opening 330 over the first drain region 350, a second opening 332 over the source region 356, and the third opening 334 over the second drain region 362.

Referring to FIG. 3G, the anti-reflection coating layer 326, the conducting layer 324 and the conformal dielectric layer 322 are patterned by removing the anti-reflection coating layer 326 exposed by the first opening 330, the second opening 332 and the third opening 334, the conducting layer 324 and the conformal dielectric layer 322 thereunder. The anti-reflection coating layer 326a, 326b, the conducting layer 324a, 324b and the conformal dielectric layer 322a, 322b are left. The remaining conducting layer 324a over the first control gate channel region 352 and the first floating gate channel region 354 serves as a first control gate layer for the flash memories. The remaining conducting layer 324b over the second floating gate channel region 358 and the second control gate channel region 360 serves as a second control gate layer of the flash memories.

Figure 3H:
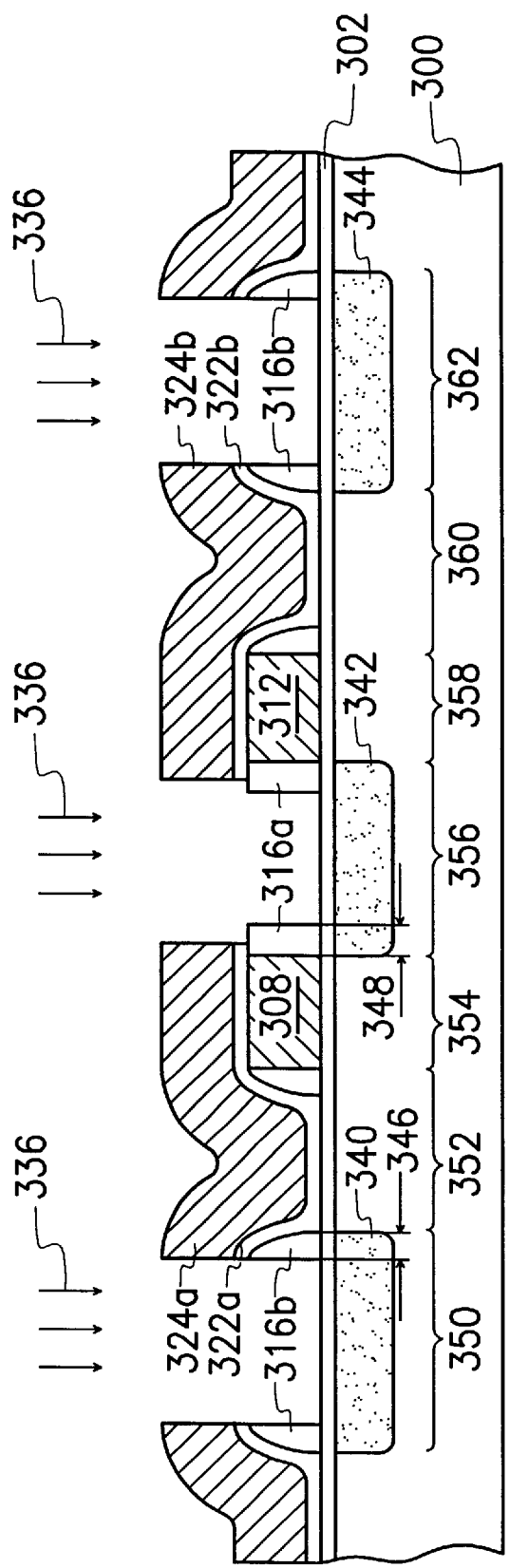

Referring to FIG. 3H, the mask layer 328 is removed. The first aligned layer 306, the second aligned layer 310, and the third aligned layer 314 are then removed, exposing the tunnelling oxide layer 302 over the first drain region 350, the source region 356, and the second drain region 362. The first aligned layer 306, the second aligned layer 310, and the third aligned layer 314 are removed by, for example, an anisotropic etching process using the anti-reflection coating layer 326a, 326b serving as an etching mask layer. An etchant comprising carbon and fluorine is used in the anisotropic etching process, which etchant has a high etching rate on the first aligned layer 306, the second aligned layer 310 and the third aligned layer 314, while the etchant has a low etching rate on the spacers 316b and the insulating material layer 316a.

Thereafter, the anti-reflection coating layers 326a, 326b are removed. A first rain 340, a source 342, and a second drain 344 are respectively formed in the first drain region 350, the drain region 356 and the second drain region 362. The first drain 340, the source 342, and the second drain 344 are formed by an ion implantion 336, while using the conducting layer 324a (the first control gate layer) and the conducting layer 324b (the second control gate layer) as mask layers, to implant dopants such as n-type ions into the substrate 300 with a concentration of about $10E13/cm^2–10E15/cm^2$. An annealing process is then conducted to activate the dopants, so that the first drain 340, the source 342, and the second drain 344 are formed.

In the present invention, the first aligned layer 306, the second aligned layer 310 and the third aligned layer 314 are formed on the first drain region 350, the source region 356 and the second drain region 362 in advance. The insulating material layer 316a and the spacers 316b are then formed on the gap 320 and the sidewalls of the first aligned layer 306, the second aligned layer 310, and the third aligned layer 314. The etching rates of the spacers 316b and the insulating material layer 316a are different from the etching rates of the first aligned layer 306, the second aligned layer 310 and the third aligned layer 314. Therefore, the spacer 316b and the insulating material layer 316a can be left when removing the first aligned layer 306, the second aligned layer 310 and the third aligned layer 314. The spacer 316b and the insulating material layer 316a can be used as ion implantation mask layers during the formations of first drain 340, source 342, and the second drain 344, so that the dopants can be implanted into the substrate 300 under the first aligned layer 306, the second aligned layer 310 and the third aligned layer 314.

The thickness 346 of the spacers 316b and the thickness 348 of the insulating layer 316a are larger than the misalignment error of photolithography. Therefore, if misalignment occurs during the photolithography process for patterning the second conducting layer 324, the tunneling oxide layer 302 over the first control gate channel region 352 and the second control gate channel region 360 is not exposed after removing the first aligned layer 306, the second aligned layer 310, and the third aligned layer 314. The spacers 316b and the insulating layer 316a can serve as a mask during the implantion 336 to form the first drain 340, the source 342 and the second drain in the positions of the first aligned layer 306, the second aligned layer 310 and the third aligned layer 314, respectively. Consequently, the first drain 340, the source 342, and the second drain 344 are formed by self-alignment in the positions of the first aligned layer 306, the second aligned layer 310 and the third aligned layer 314, respectively.

The first drain 340, the source 342 and the second drain 344 are formed in the positions of the first aligned layer 306, the second layer 310 and the third aligned layer 314, respectively, by self-alignment. The position of one of the sidewalls of the first floating gate 308, which sidewall is near the first drain 340, is decided after the first aligned layer 306, the first floating gate layer 308, the second aligned layer 310, the second floating gate layer 312, and the third aligned layer 314 are formed. Similarly, the position of one of the sidewalls of the second floating gate 312, which sidewall is near the second drain 344, is also decided after the first aligned layer 306, the first floating gate layer 308, the second aligned layer 310, the second floating gate layer 312, and the third aligned layer 314 are formed. Therefore, the length of the first control gate channel region 352 between the first floating gate layer 308 and the first drain 340, and the length of the second control gate channel 362 between the second floating gate layer 312 and the second drain 344 are fixed, while the positions of the first aligned layer 306, the first floating gate layer 308, the second floating gate layer 312, and the third aligned layer 314 are decided. The length of the first control gate channel 352 and the length of the second control gate channel 360 are not affected by the process of patterning the second conducting layer 324 for forming the first control gate layer 324a and the second control gate layer 324b. Consequently, the channel length of the control gate can be control by self aligned, and is not changed even if misalignment occurs during the photolithography process.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a self-aligned split gate of a flash memory, comprising:

providing a substrate, the substrate being divided sequentially into a first drain region, a first control gate channel region, a first floating gate channel region, a source region, a second floating gate channel region, a second control gate channel region, and a second drain region;

sequentially forming a tunnelling oxide layer and a first conducting layer over the substrate;

patterning the first conducting layer to form a first aligned layer, a second aligned layer, and a third aligned layer, wherein the first aligned layer covers a part of the first drain region, the second aligned layer covers the first floating gate channel region, the source region and the second floating gate channel region, and the third aligned layer covers a part of the second drain region;

forming spacers on sidewalls of the first aligned layer, the second aligned layer, and the third aligned layer;

forming a conformal dielectric layer over the substrate;

forming, a second conducting layer on the conformal dielectric layer;

forming a mask layer on the second conducting layer, which mask layer has a first opening over the first drain region, a second opening over the source region, and a third opening over the second drain region;

removing the second conducting layer exposed by the first, the second, and the third opening, the dielectric layer and the first aligned layer, a part of the second aligned layer, and the third aligned layer thereunder by a self-aligned process to expose the tunnelling oxide layer over the first drain region, the source region, and the second drain region, so that a remaining second aligned layer over the first floating gate channel region is used as a first floating gate layer, a remaining second aligned layer over the second floating gate channel region is used as a second floating gate layer, a remaining second conducting layer over the first control gate channel region and the first floating gate channel region are used as a first control gate layer, and a remaining second conducting layer over the second control gate channel region and the second floating gate channel region are used as a second control gate layer;

removing the mask layer; and forming a first drain in the first drain region, a source in the source region and a second drain in the second drain region.

2. The method as claimed in claim 1, wherein an etching rate of the spacers is different from an etching rate of the first conducting layer.

3. The method as claimed in claim 2, wherein a material of the first conducting layer comprises doped polysilicon, and a material of the spacers comprise silicon oxide.

4. The method as claimed in claim 1, wherein the step of forming the spacers further comprises:

forming a spacer material layer over the substrate; and etching back the spacer material by an anisotropic etching process to form the spacers on the sidewalls of the first aligned layer, the second aligned layer, and the third aligned layer.

5. The method as claimed in claim 1, wherein the step of removing the second conducting layer exposed by the first, the second, and the third opening, the dielectric layer and the first aligned layer, a part of the second aligned layer, and the third aligned layer thereunder is performed by a etching process using an etchant, which etchant has a high etching rate on the first aligned layer, the second aligned layer and the third aligned layer, while the etchant has a low etching rate on the spacers.

6. The method as claimed in claim 1, further comprising forming an anti-reflection layer on the substrate before forming the mask layer, and removing the anti-reflection layer after removing the mask layer.

7. The method as claimed in claim 1, wherein the step of forming the first drain, the source, and the second drain comprises an ion implantion and an annealing process.

8. The method as claimed in claim 1, wherein a material of the second conducting layer comprises doped polysilicon.

9. The method as claimed in claim 1, wherein a material of the dielectric layer comprises an oxide/nitride/oxide structure.

10. A method of a self-aligned split gate of a flash memory, comprising:

providing a substrate, the substrate being divided sequentially into a first drain region, a first control gate channel region, a first floating gate channel region, a source region, a second floating gate channel region, a second control gate channel region, and a second drain region;

forming sequentially a tunnelling oxide layer and a first conducting layer over the substrate;

patterning the first conducting layer to form a first aligned layer, a first floating gate layer, a second aligned layer, a second floating gate layer, and a third aligned layer, wherein the first aligned layer covers a part of the first drain region, the first floating gate layer covers the first floating gate channel region, the second aligned layer covers a part of the source region, the second floating gate layer covers the second floating gate channel region, the third aligned layer covers a part of the second drain region, and there are gaps between the first floating gate layer and the second aligned layer and between the second aligned layer and the second floating gate layer;

filling the gap with an insulating layer and forming spacers on sidewalls of the first aligned layer, the first floating gate layer, the second floating gate layer, and the third aligned layer;

forming a conformal dielectric layer and a second conducting layer over the substrate;

removing the conformal dielectric layer and the second conducting layer over the first aligned layer, the second aligned layer, and the third aligned layer, so that a remaining second conducting layer over the first control gate channel region and the first floating gate channel region is used as a first control gate layer, and a remaining second conducting layer over the second control gate channel region and the second floating gate channel region is used as a second control gate layer;

removing the first aligned layer, the second aligned layer, and the third aligned layer; and forming a first drain in the first drain region, a source in the source region, and a second drain in the second drain region.

11. The method as claimed in claim 10, wherein the step of filling the gap with the insulating layer and forming the spacers on the sidewalls of the first aligned layer, the first floating gate layer, the second floating gate layer, and the third aligned layer comprises:

forming a insulating material layer covering the spaces between the first floating gate layer, the second aligned layer, the first floating gate layer and the second floating gate layer;

forming a mask layer covering the insulating material layer in the gaps;

performing an etching back process on the insulating material layer by an anisotropic etching process using the mask layer as an etching mask to form the spacers on the sidewalls of the first aligned layer, the first floating layer, the second floating gate layer, and the third aligned layer; and removing the mask layer.

12. The method as claimed in claim 11, wherein the step of forming the insulating material layer comprises:

forming a material layer over the substrate covering the first aligned layer, the first floating gate layer, the second aligned layer, the second floating gate layer, and the third aligned layer, and filling the spaces of each others; and etching back the material layer to expose surfaces of the first aligned layer, the first floating gate layer, the second aligned layer, the second floating gate layer and the third aligned layer.

13. The method as claimed in claim 10, wherein the step of removing the conformal dielectric layer and the second conducting layer over the first aligned layer, the second aligned layer and the third aligned layer comprises:

forming a mask layer on the substrate, wherein the mask layer has a first opening over the first aligned layer, a second opening over the second aligned layer, and a third opening over the third aligned layer to expose the second conducting layer;

removing the second conducting layer exposed by the first opening, the second opening, and the third opening, and the conformal dielectric layer thereunder, so that a remaining second conducting layer over the first control gate channel region and the first floating gate channel region is used as a first control gate layer, and a remaining second conducting layer over the second control gate channel region and the second floating gate channel region is used as a second control gate layer; and removing the mask layer.

14. The method as claimed in claim 13, further comprising forming an anti-reflection layer on the substrate before forming the mask layer, and removing the anti-reflection layer after removing the mask layer.

15. The method as claimed in claim 10, wherein an etching rate of the spacers is different from an etching rate of the first conducting layer, and an etching rate of the insulating layer is different from the etching rate of the first conducting layer.

16. The method as claimed in claim 10, wherein the step of removing the first aligned layer, the second aligned layer, and the third aligned layer is performed by an etching process using an etchant, which etchant has a high etching rate on the first aligned layer, the second aligned layer and the third aligned layer and a low etching rate on the spacers and the insulating layer.

17. The method as claimed in claim 10, wherein the step of forming the first drain, the source, and the second drain comprises an ion implantion and an annealing process.

18. The method as claimed in claim 10, wherein materials of the first and the second conducting layer comprise doped polysilicon.

19. The method as claimed in claim 10, wherein materials of the spacers and the insulating layer comprise silicon oxide.

20. The method as claimed in claim 10, wherein a material of the dielectric layer comprises an oxide/nitride/oxide structure.

* * * * *